United States Patent [19]
Hauf et al.

[11] Patent Number: 5,721,448
[45] Date of Patent: Feb. 24, 1998

[54] INTEGRATED CIRCUIT CHIP HAVING ISOLATION TRENCHES COMPOSED OF A DIELECTRIC LAYER WITH OXIDATION CATALYST MATERIAL

[75] Inventors: Manfred Hauf; Max G. Levy, both of Wappingers Falls; Victor Ray Nastasi, Hopewell Junction, all of N.Y.

[73] Assignee: International Business Machines Corporation, Armonk, N.Y.

[21] Appl. No.: 688,458

[22] Filed: Jul. 30, 1996

[51] Int. Cl.$^6$ .............. H01L 29/76; H01L 29/00
[52] U.S. Cl. .............. 257/501; 257/500; 257/506; 257/510; 257/513; 257/374; 257/397; 257/392
[58] Field of Search .............. 257/244, 302, 257/329, 330, 332, 333, 410, 374, 392, 395, 396, 397, 500, 501, 502, 506, 510, 508, 513

[56] References Cited

U.S. PATENT DOCUMENTS

| | | | |
|---|---|---|---|
| 4,356,211 | 10/1982 | Riseman | 427/85 |
| 4,420,874 | 12/1983 | Funatsu | 29/576 W |
| 4,623,437 | 11/1986 | Visca et al. | 204/157.47 |
| 4,986,878 | 1/1991 | Malazgirt et al. | 156/643 |
| 5,072,269 | 12/1991 | Hieda | 257/302 |
| 5,075,248 | 12/1991 | Yoon et al. | 437/52 |
| 5,078,801 | 1/1992 | Malik | 134/29 |
| 5,217,919 | 6/1993 | Gaul et al. | 437/67 |
| 5,240,875 | 8/1993 | Tsou | 437/72 |
| 5,292,679 | 3/1994 | Anzai | 437/52 |
| 5,313,419 | 5/1994 | Chang | 365/182 |
| 5,316,965 | 5/1994 | Philipossian et al. | 437/70 |
| 5,327,374 | 7/1994 | Krautschneider et al. | 257/302 |
| 5,358,894 | 10/1994 | Fazan et al. | 437/70 |
| 5,397,725 | 3/1995 | Wolstenholm et al. | 437/43 |
| 5,422,294 | 6/1995 | Noble, Jr. | 437/52 |
| 5,448,090 | 9/1995 | Geissler et al. | 257/305 |
| 5,489,544 | 2/1996 | Rajeevakumar | 437/52 |
| 5,502,321 | 3/1996 | Matsushita | 257/317 |
| 5,536,675 | 7/1996 | Bohr | 437/67 |

FOREIGN PATENT DOCUMENTS 242 905 A1  2/1987  German Dem. Rep.

*Primary Examiner*—Tom Thomas
*Assistant Examiner*—Fetsum Abraham
*Attorney, Agent, or Firm*—Whitham, Curtis, Whitham & McGinn; Daryl K. Neff, Esq.

[57] ABSTRACT

An integrated circuit with FETs having an essentially uniform gate oxide thickness and FETs having gate oxide thickness enhanced along the sides. FETs with enhanced gate oxide have an ONO layer diffused with potassium in close proximity to the enhanced (thicker) oxide, and, as a result, have a slightly higher $V_t$ and much more attenuated soft turn on.

7 Claims, 15 Drawing Sheets

| Device Type | Corner $V_t$ (mV) | $I_{ds}$ (μA) | 10μm wide channel $V_t$ (mV) | Retention Ltd Yield for GIDL @256ms |
|---|---|---|---|---|
| Preferred Embodiment | 1005 | 118 | 1210 | 79% |
| Prior Art | 740 | 120 | 1220 | 30% |

INTEGRATED CIRCUIT CHIP HAVING ISOLATION TRENCHES COMPOSED OF A DIELECTRIC LAYER WITH OXIDATION CATALYST MATERIAL

RELATED APPLICATIONS

This application is related to and is being filed concurrently with U.S. Ser. No. 08/688,346, filed Jul. 30, 1996, entitled "A Method of Manufacturing An Insulated Gate Field Effect Transistor", and also U.S. Ser. No. 08/688,457, filed Jul. 30, 1996, entitled "An Insulated Gate Field Effect Transistor", both of which are assigned to the Assignee of this application.

FIELD OF THE INVENTION

This invention relates generally to the manufacturing of semiconductor devices, and more particularly to an integrated circuit formed on a semiconductor wafer.

BACKGROUND OF THE INVENTION

High performance and density are primary objectives of Integrated Circuit (IC) chip design. One way chip designers approach both of these objectives is by making devices and device features smaller. The smaller the device feature (and other circuit features), the tighter that circuit devices can be packed together and, consequently, the higher the circuit density. The tighter together the circuit devices are packed, the lower the wiring loads and, consequently, the faster the circuit, i.e., the higher the circuit performance. So, semiconductor process designers concentrate on reducing device features to make devices smaller and smaller.

Just shrinking Field Effect Transistor (FET) channel length alters device characteristics such as punch through voltage and threshold voltage ($V_t$) to the point where the device may be unusable. So, other device parameters such as, channel doping, source/drain doping and gate oxide thickness are altered to compensate for device characteristic changes. Normally, the channel doping profile is altered to compensate for effects of the shorter channel (short channel effects). However, changes in the doping profile raise the $V_t$, so the doping profile change is usually accompanied with a thinner gate oxide to lower the $V_t$. Thinning the gate oxide intensifies the electric field from the gate on the channel. Consequently, gate capacitance per unit area is increased, gate area is decreased, and channel transconductance is increased. Overall, circuit performance improves.

Unfortunately, as device features shrink, what had been considered superficial imperfections for older larger devices are significant flaws. Thinner gate oxide makes devices more susceptible to these flaws causing leakages and defects that reduce chip yield and impair chip reliability. Yield loss related increase in chip cost is easy to quantify because completed wafer cost must be recovered from fewer chips. Reduced reliability related cost, cost from chips failing in normal use, is a more expensive problem. These reliability failures are more expensive because they cause system down time and because of the field cost associated with finding the failing component in an assembled system containing many chips.

FIG. 1 is a cross-sectional representation of an FET built in a 64M DRAM process. There are two deep trenches 100 on either side of the FET 102 that isolate it from adjacent FETs. An oxide collar 104 along the trench 100 sidewalls 106 isolates the FET 102 from polysilicon 108 that fills the trench and is, for example, a Dynamic Random Access Memory (DRAM) cell capacitor storage plate. The gate of the FET 102 is formed by a polysilicon word line 110 that runs across a thin gate oxide layer 112 the width of the FET 102. FET current flow, from drain to source (not shown), is perpendicular to the polysilicon gate and the word line 110.

A depression 114 was formed at each side of the channel when excess oxide was removed from the collar 104. Furthermore, collar 104 oxide formation rounded the channel sides 116. Consequently, the channel 102, while nearly planar in the center, is rounded at its sides 116. The depression 114 and channel 102 rounding at its sides 116 are flaws that were considered superficial artifacts for larger featured FETs. However, for a 64M DRAM process, they are not superficial. Poly in the depression 114 and on the rounded sides 116 enhances the E-field so that it is much more intense there than on the rest of the channel. As a result of this intensified E field, the channel sides 116 have a lower $V_t$ than the rest of the channel 102. So, the channel 102 does not turn on at one uniform gate to source voltage ($V_{gs}$). Instead, the sides 116 turn on before and off after (i.e. with a smaller $V_{gs}$) the rest of the FET 102.

While this condition might be negligible for logic, it is unacceptable for a DRAM pass gates, because it increases pass gate channel leakage. Pass gate channel leakage allows stored charge on the storage plate to dissipate faster. This shortens DRAM retention time, i.e., the length of time that data may be stored in a DRAM cell without it needing to be reinforced or refreshed. Generally, refresh frequency is minimized because during refresh, the DRAM is unaccessible or unavailable. However, a DRAM cell with a short retention time must be refreshed more frequently than a cell with a long retention time. Consequently, a short retention time is undesirable. Thus, it is important to minimize channel leakage and so, to make FETs with planar channels for DRAMs.

PURPOSES OF THE INVENTION

It is a purpose of the invention to selectively reduce FET channel leakage.

It is another purpose of the present invention to selectively reduce channel variations in FET threshold voltage.

It is another purpose of the present invention to increase DRAM cell retention time.

It is yet another purpose of the present invention to reduce FET feature size.

It is yet another purpose of the present invention to selectively reduce FET feature size without reducing DRAM cell retention time.

It is yet another purpose of the invention to selectively reduce FET feature size without increasing channel leakage.

It is yet another purpose of the invention to improve threshold voltage uniformity on reduced feature size FETs.

It is yet another purpose of the invention to reduce channel leakage and variations in threshold voltage without impairing DRAM cell retention time for reduced feature size FETs.

SUMMARY OF THE INVENTION

The present invention is an integrated circuit including a plurality of first FETs with uniform gate oxide and a plurality of second FETs isolated on either side by a trench. Each second FET has a dielectric layer in the isolating trench along at least one side. The dielectric layer which may be an ONO layer has an oxidation catalyst diffused into it. The oxidation catalyst may be potassium. A gate oxide along the side of the second FET in close proximity to the ONO layer is thicker than gate oxide between both sides.

BRIEF DESCRIPTION OF THE DRAWINGS

FIG. 7 is a table comprising electrical parameters of FETs, grown according to the prior art with a preferred embodiment FET.

DESCRIPTION OF THE PREFERRED EMBODIMENTS

The present invention is an FET and the process of forming the FET. The FET of the present invention has a thicker gate oxide along channel sides than on the interior of the channel. A layer of silicon Oxide-silicon Nitride-silicon Oxide (ONO) formed at the sides of the channel region includes a catalyst that enhances local oxide formation. The preferred catalyst is potassium.

Figure 1:
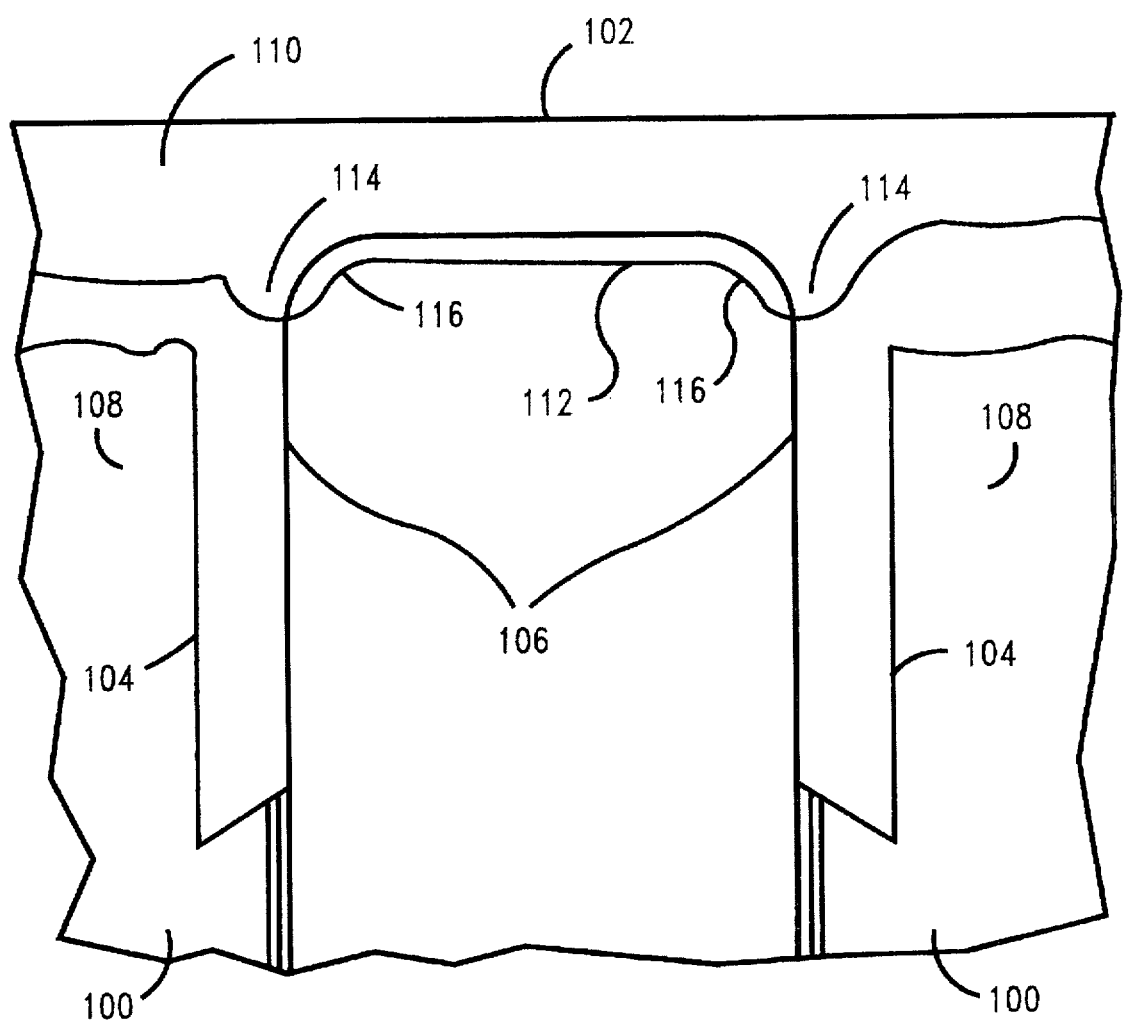
FIG. 1 is a cross-sectional representation of an FET in a DRAM made by a prior art manufacturing process.
Figure 2A:
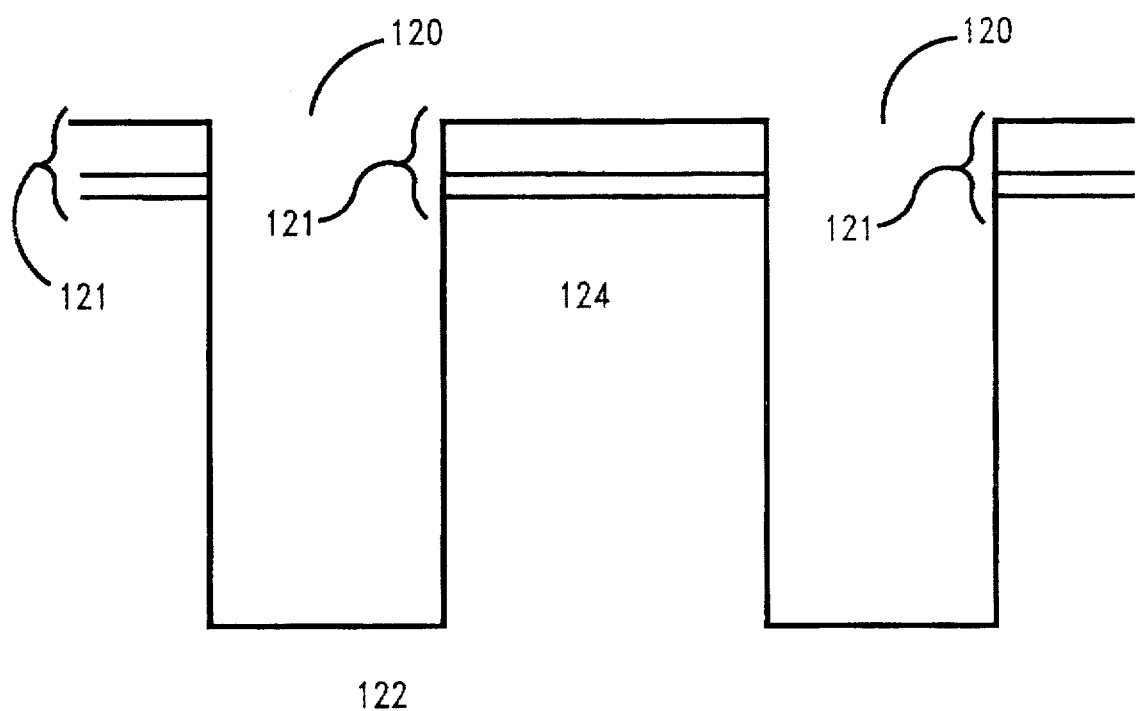
FIGS. 2A–F represent the steps in forming a preferred embodiment FET.

FIGS. 2A–F represent the steps in forming the preferred embodiment FET which is essentially as depicted in FIG. 2F. First, in FIG. 2A, deep trenches 120 are formed in a semiconductor layer (or wafer) 122. Prior to forming trenches 120, a pad dielectric stack, represented by layer stack 121, is formed on the semiconductor layer 122. The trenches 120 are etched through the pad stack 121 and into the wafer 122 to isolate and define an FET region 124. A channel, source and drain will be formed in this defined FET region 124. Preferably, the semiconductor layer is silicon. In the preferred embodiment, the FET, when complete, is a passgate transistor of a Dynamic Random Access Memory (DRAM) cell. The DRAM cell's storage capacitor plate is formed in the trench 120.

Figure 2B:
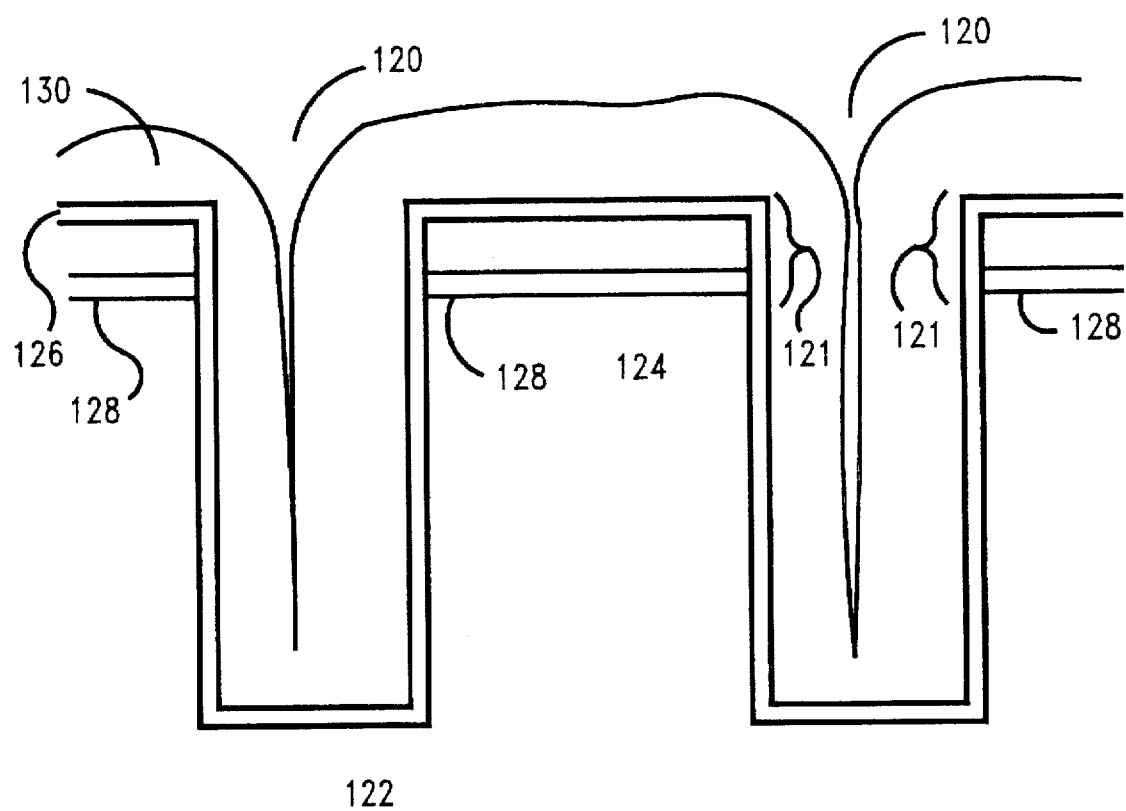

In FIG. 2B, an ONO layer 126 is conformally formed on the pad stack 121 and in trenches 120. Although referred to as a single layer, it is understood that the ONO layer 126 is a thin nitride layer sandwiched between two thin oxide layers. The ONO layer 126 lines the trenches 120, extending vertically along the sides of each trench 120 past the surface 128 of the wafer 122 and along the pad stack 121. Next, an N⁺ polysilicon (poly) layer 130 is deposited on the ONO layer 126.

Figure 2C:
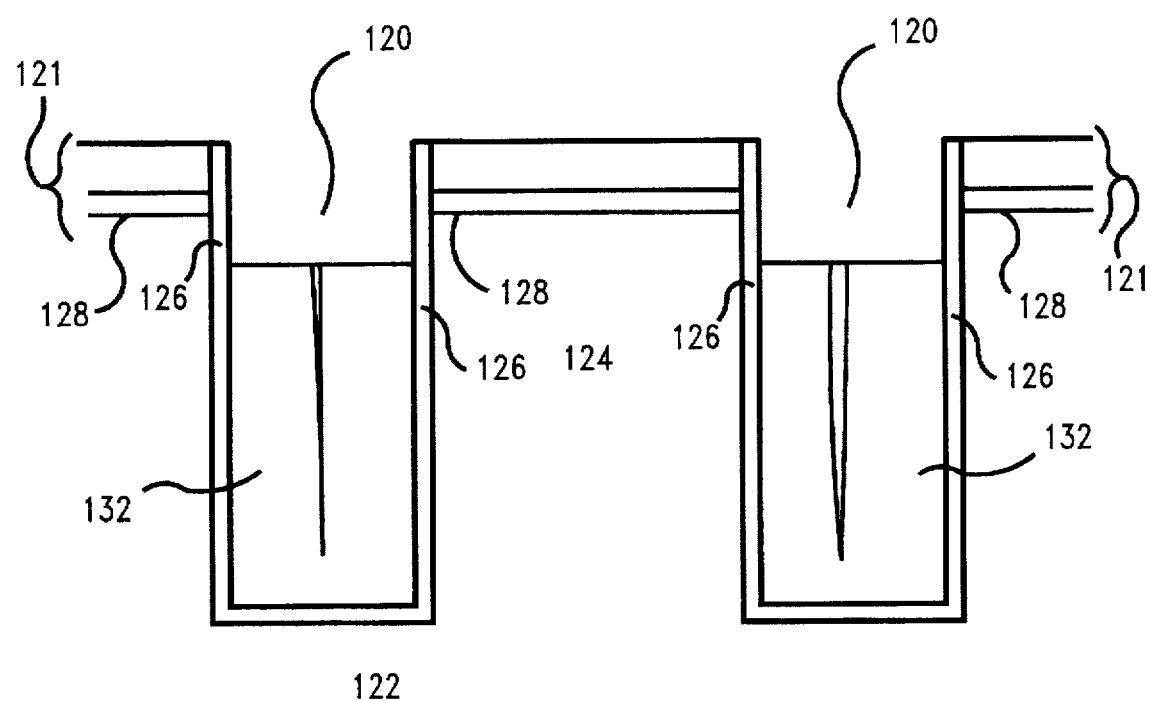

In FIG. 2C, the polysilicon layer 130 is removed from above the pad stack 121 so that polysilicon 132 remains only in the trenches 120. Preferably, the polysilicon layer 130 is removed using Chemical-Mechanical Polish (CMP). Polishing the polysilicon layer 130 also removes most of the ONO layer 126 lying on the pad stack 121 such that ONO remains mainly in the trenches 120. After CMP, residual ONO layer 126 is removed from the pad stack 121. Then, the remaining polysilicon 130 is etched by Reactive Ion Etching (RIE) such that the remaining poly 132 in the trenches is recessed beneath the wafer surface 128, preferably, by 1.3 μm. The preferred slurry for removing the poly layer 130 is a poly slurry in Potassium Hydroxide, preferably <0.1% KOH. The silicon nitride in the ONO layer 126 is a diffusion barrier to the potassium in the slurry. So, potassium diffuses into the ONO layer 126, through the outer oxide and collects at the nitride. Optionally, to enhance the level of collected potassium, the wafer may be dipped in a tank of KOH solution.

These steps of polishing the poly layer 130 with a slurry containing KOH and the optional dip are contrary to conventional semiconductor chip manufacturing practices. Normally, such a use of potassium is avoided in semiconductor chip manufacture because potassium readily diffuses into silicon. Therefore, using a KOH slurry would, effectively, poison the silicon, making it unusable for forming FETs. However, the ONO layer 126 blocks diffusion of the potassium and instead, collects the potassium along the interface between the outer oxide and the nitride.

Figure 2D:
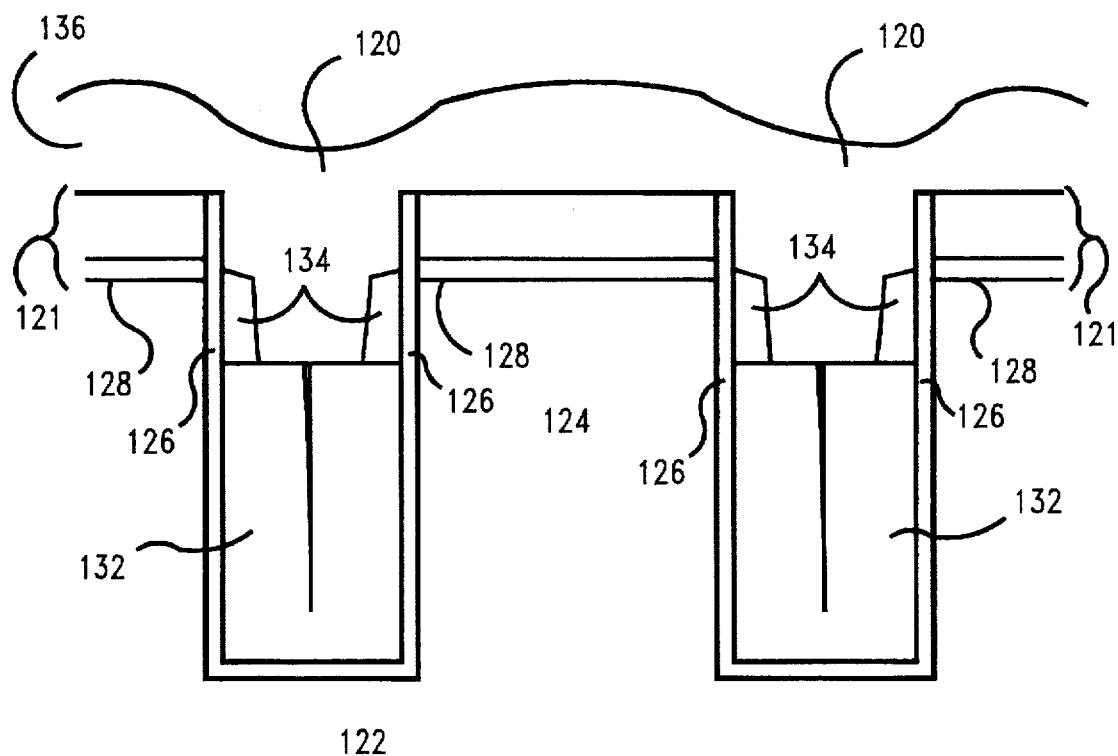
Figure 2:
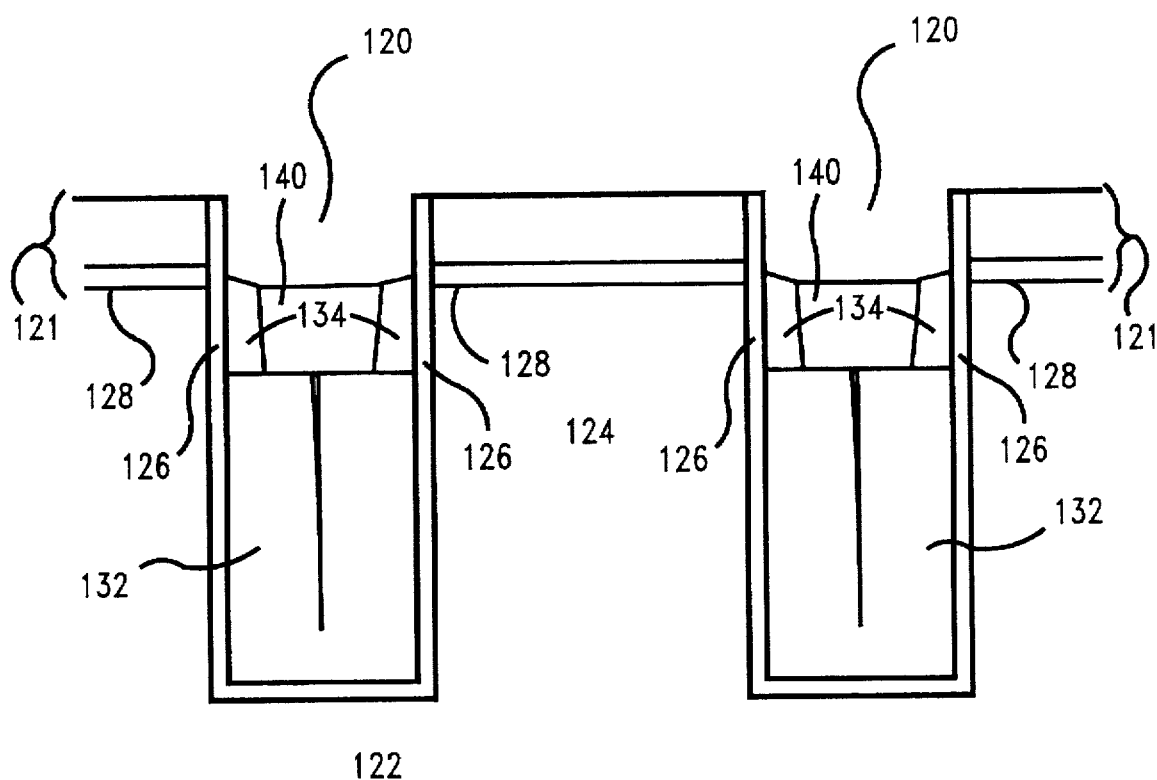
Figure 2:
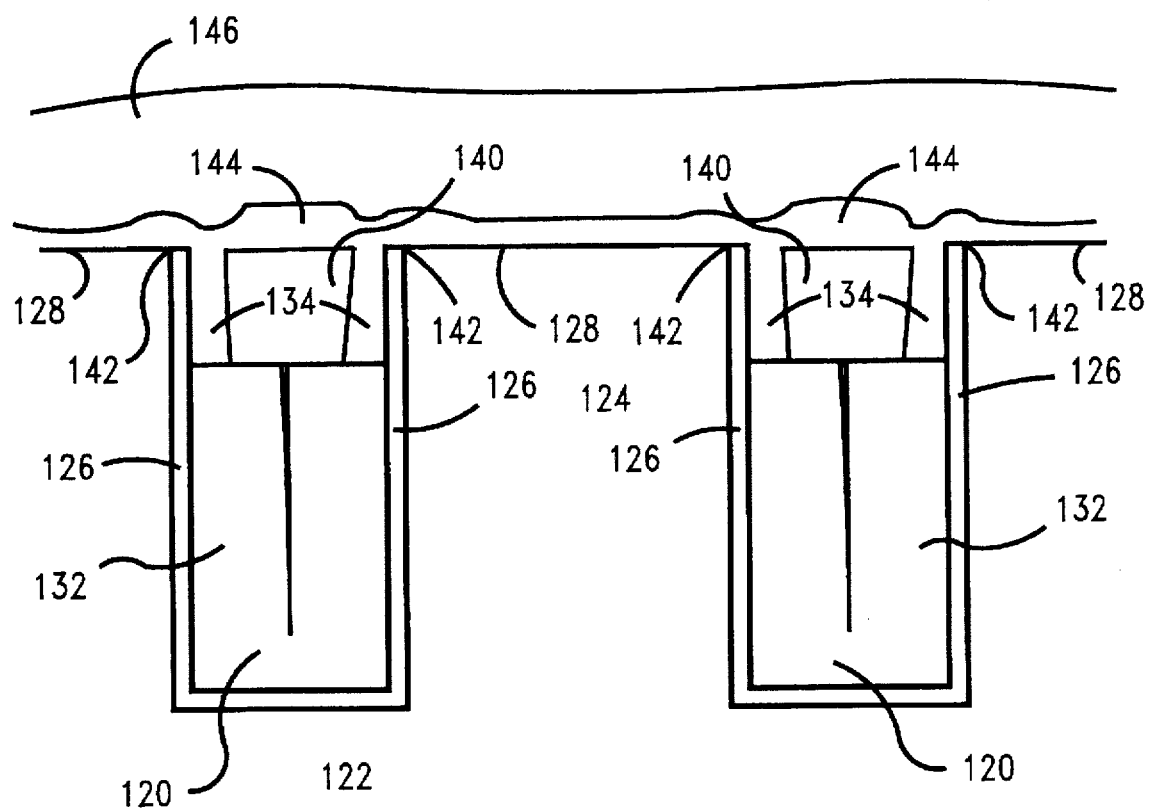

Next, in FIG. 2D, an Oxide collar 134 is selectively formed in the trenches 120 on the poly 132, along the ONO layer 126. After forming the collars 134, another N⁺ poly layer 136 is formed on the wafer 122. This second poly layer 136 re-fills the trenches 120 with polysilicon.

In FIG. 2E, the poly layer 136 is removed from the pad stack 121 using CMP and RIE such that poly 140 remains only in the trenches 120. The poly 140 in the trenches 120 is coplanar with, or, slightly recessed from the wafer surface 128. As in the previous poly removal step, the preferred slurry is a poly slurry with <0.1% KOH. As shown in FIG. 2F, an oxide 144 is deposited to isolate the poly 140 in the trenches 120. Pad stack 121 is removed. A screen oxide layer (not shown) is grown in dry $O_2$ on the exposed wafer surface 128 and poly 140, taking care to avoid removing the potassium from along the ONO layer 126. Then, N or P wells (if required) are defined. Next an appropriate dopant(s) is (are) ion implanted for channel tailoring. Then, the implanted dopant is diffused to the wafer as desired to bulk dope the silicon substrate 122.

After diffusing the implanted dopants, the screen oxide layer is removed and gate oxide may be grown. The potassium along the ONO layer 126 in the trenches 120 that was collected by the nitride is a catalyst for silicon oxidation. So, as depicted in FIG. 2F, the gate oxide is thicker along the sides 142 of the channel, i.e., in close proximity to the ONO layer 126.

Figure 3A:
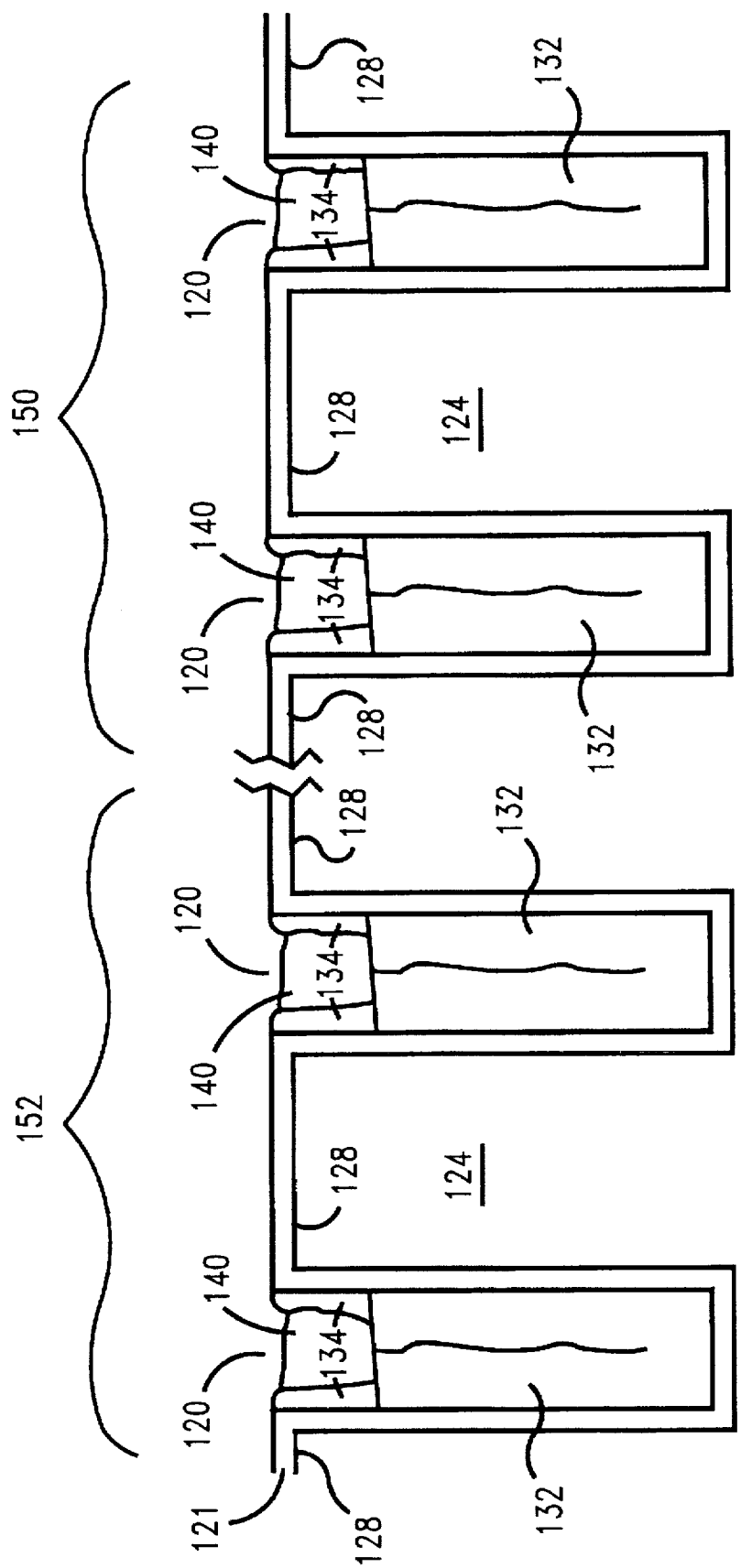
FIGS. 3–C represent the steps in selectively forming FETs with enhanced gate oxide and FETs with unenhanced gate oxide on the same chip.
Figure 3B:
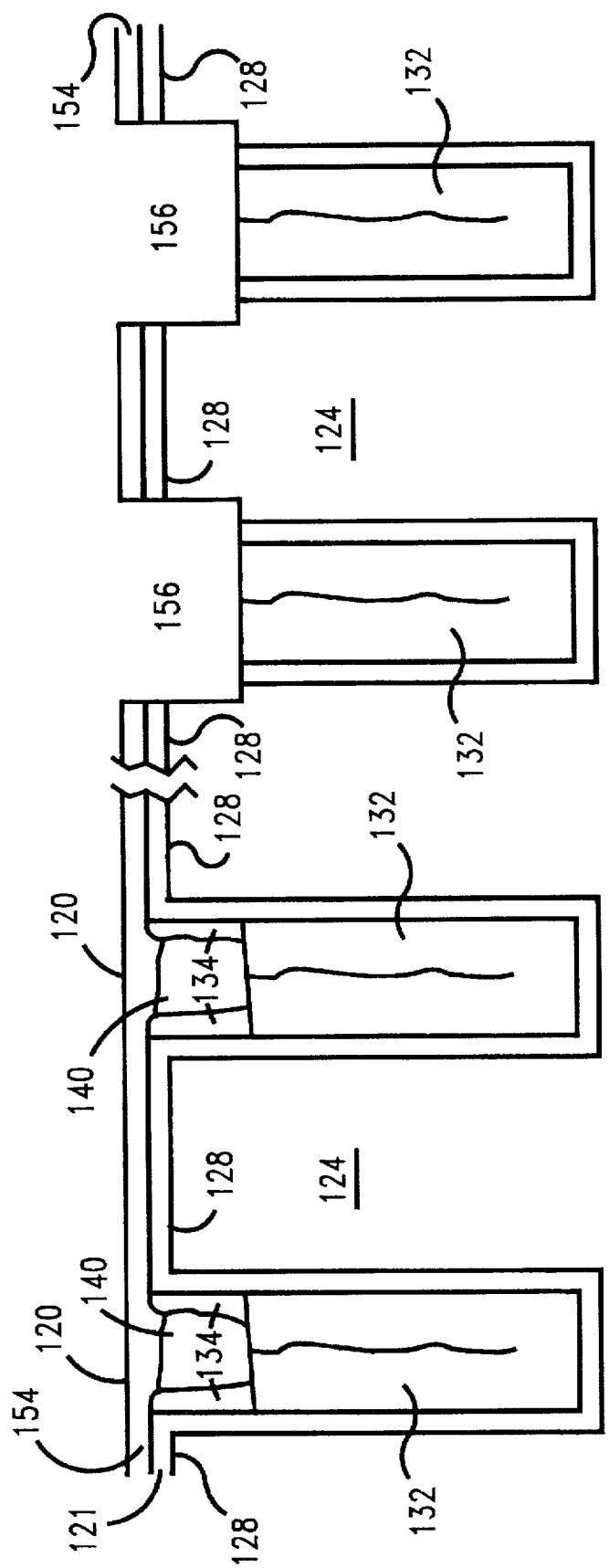
Figure 3C:
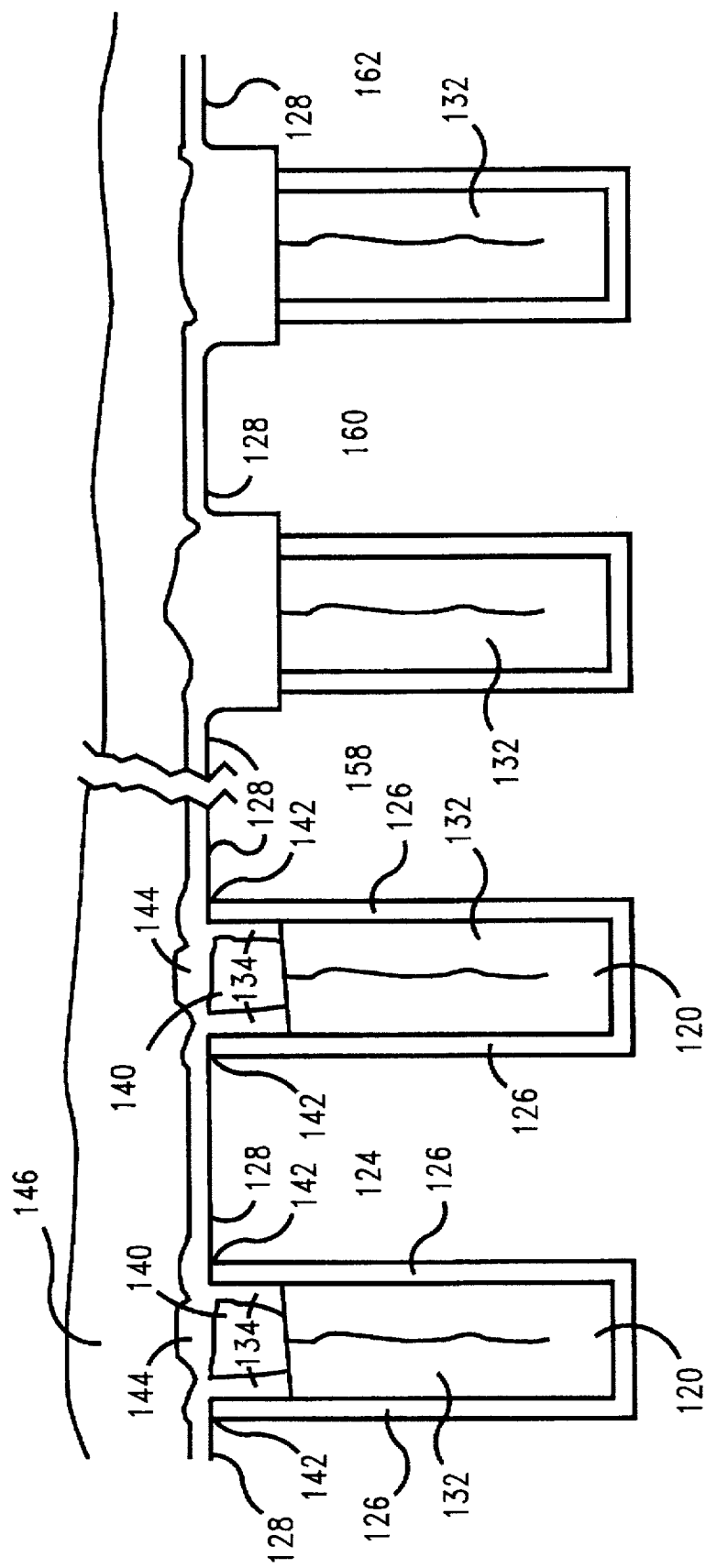

As represented in FIGS. 3A–C, the ONO layer may be selectively removed in non-array areas 150, prior to growing gate oxide. This results in transistors with enhanced side oxide in arrays 152 and normal transistors with unenhanced oxide in non-array areas 150. So, in FIG. 3A, all devices, both in array areas 152 and in non-array 150, are processed as described above for the preferred embodiment transistor, through the N-well/P-well definition and bulk doping as described above with reference to FIG. 2E.

However, prior to gate oxide formation, in FIG. 3B, a masking layer 154 is formed to define shallow trenches 156 in non-array areas 150. After forming the shallow trench pattern in masking layer 154, the shallow trenches 156 are etched. The shallow trenches extend beyond the deeper trenches 120 and, so, the ONO layer is removed from the vicinity of channel areas 158, 160, 162 in the non-array area 150.

Finally, in FIG. 3C, gate oxide 164 is formed and the poly word line 146 and poly gates 166 are patterned from a poly layer formed on the gate oxide layer 164. An integrated circuit thus formed has FETs with essentially uniform gate oxide thickness in non-array areas 150 and with enhanced gate oxide in array areas 152.

EXAMPLES

Figure 4:
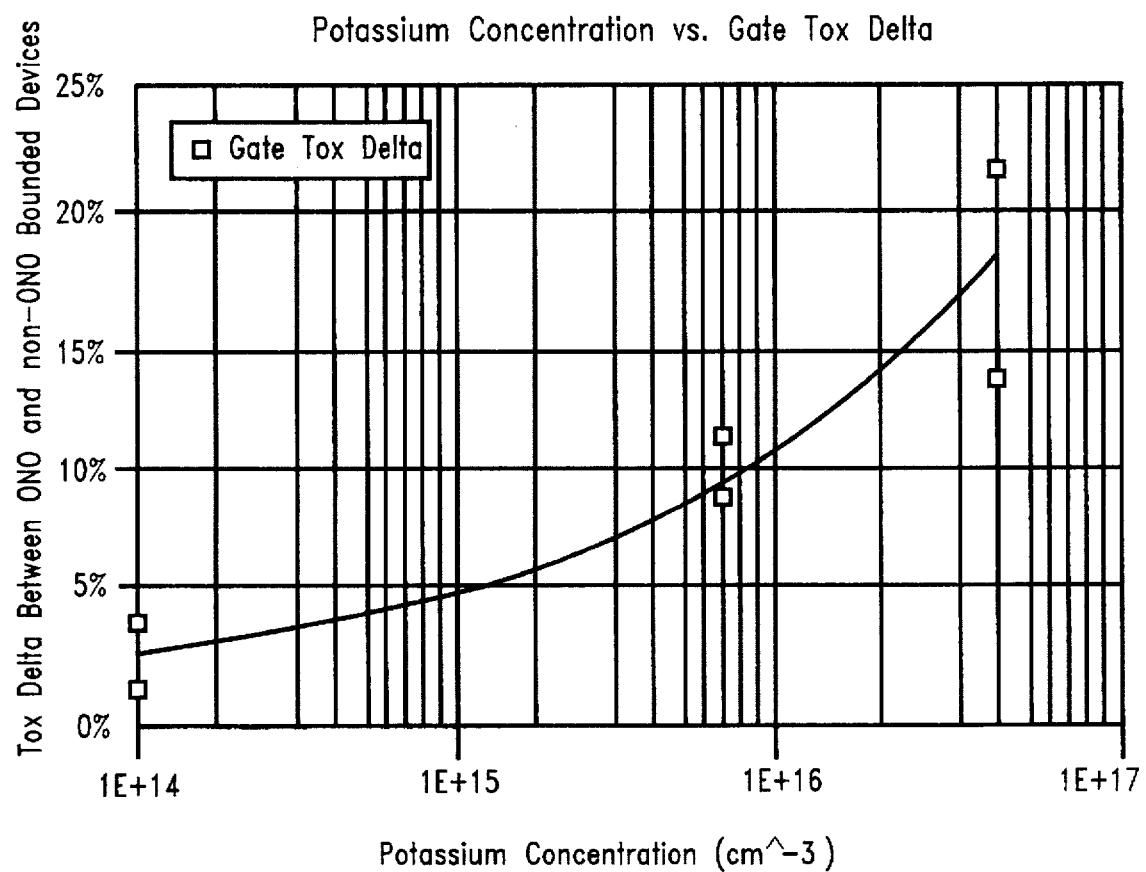
FIG. 4 is a plot of oxide thickness $T_{ox}$ versus Potassium concentrate.

FIG. 4 is a plot of increase in oxide ($T_{ox}$) thickness verses Potassium concentrate. Increasing the level of accumulated potassium increases the gate oxide thickness at the channel sides. Further, this increase in gate oxide thickness extends horizontally from the sides into the channel. The extent of the increased oxide thickness, both vertically and horizontally is dependent upon the level of potassium collected in the ONO layer. If the accumulated potassium level is increased sufficiently then, the gate oxide thickens across the entire device. The increase in thickness is inversely proportional to the horizontal distance from the ONO layer 126 (i.e. from the potassium catalyst).

In addition, growth temperature and growth media affect the amount of increase in local oxide thickness derived from the presence of potassium catalyst. The side to center oxide thickness difference is much more pronounced, i.e., much thicker at the device sides than in the device center, for gate oxide grown at 900° C. in dry $O_2$ than for gate oxide grown at 800° C. in wet $O_2$.

Figure 5:
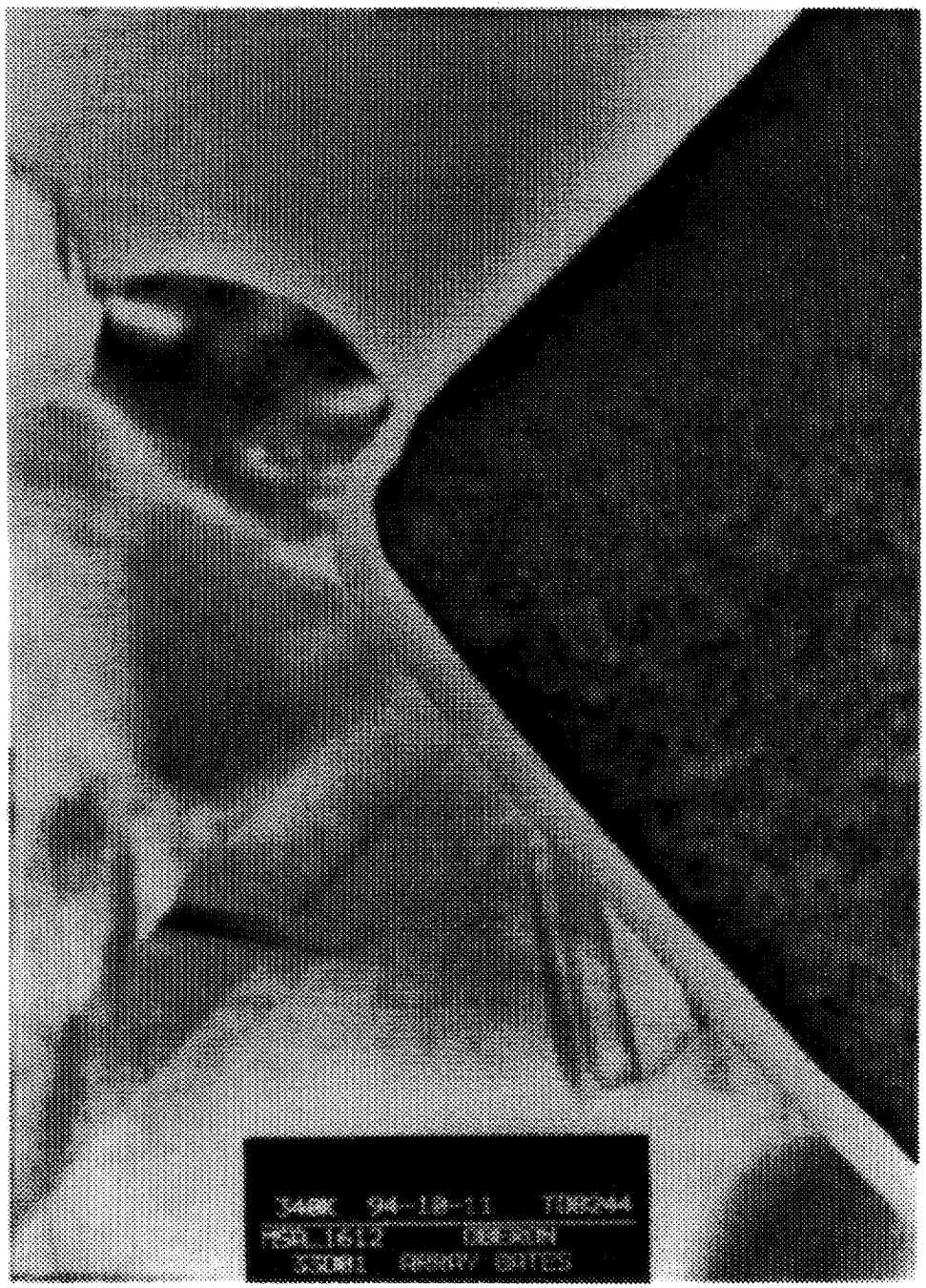
FIG. 5 is an image from a Transmission Electron Microscope (TEM) at a corner of an FET grown according to a prior art method.

FIG. 5 is a Transmission Electron Microscope (TEM) image of an FET corner (a cross-section at a side) grown according to the prior art at 900° C. in $O_2$. For this prior art FET, corner $T_{ox}$ ($T_{ox}$ along the side of the channel) is 8% thinner than center $T_{ox}$ (in the center of the channel). Thus, this prior art FET has a lower corner $V_t$ due to this thinner corner $T_{ox}$ and due to the more intense E-field from the poly both horizontally along the top channel area and vertically along the side (in the trench).

Figure 6A:
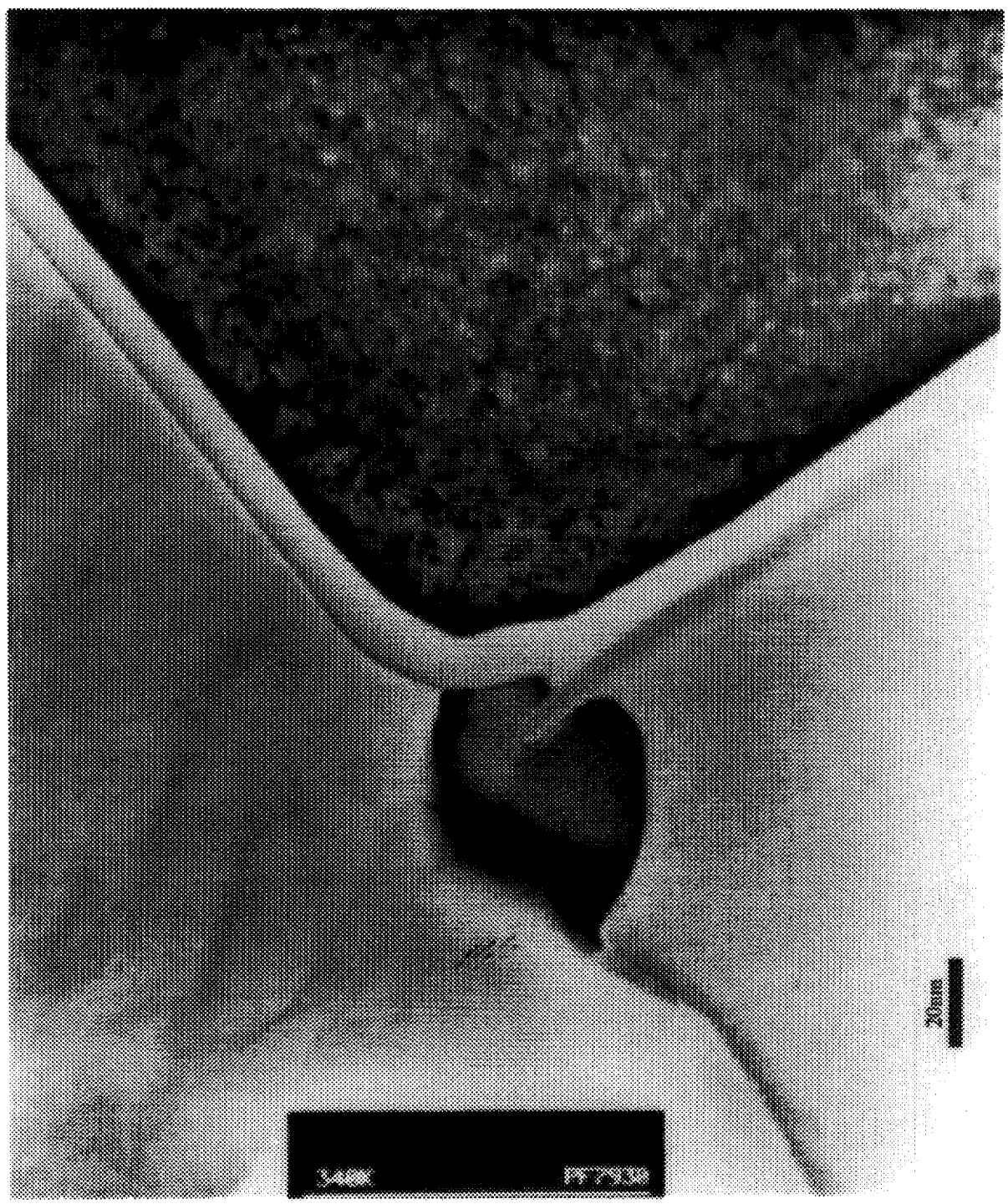
FIGS. 6A–B are TEM images of FETs grown according to the present invention.

FIG. 6A is a TEM image of an FET corner grown at 800° C. in wet $O_2$ according to the present invention. For this preferred embodiment FET, corner $T_{ox}$ is 30% thicker center $T_{ox}$. Thus, the $V_t$ is elevated along the channel sides over that of the prior art FET. Further, the E-field is attenuated somewhat by the thicker corner $T_{ox}$.

Figure 6B:
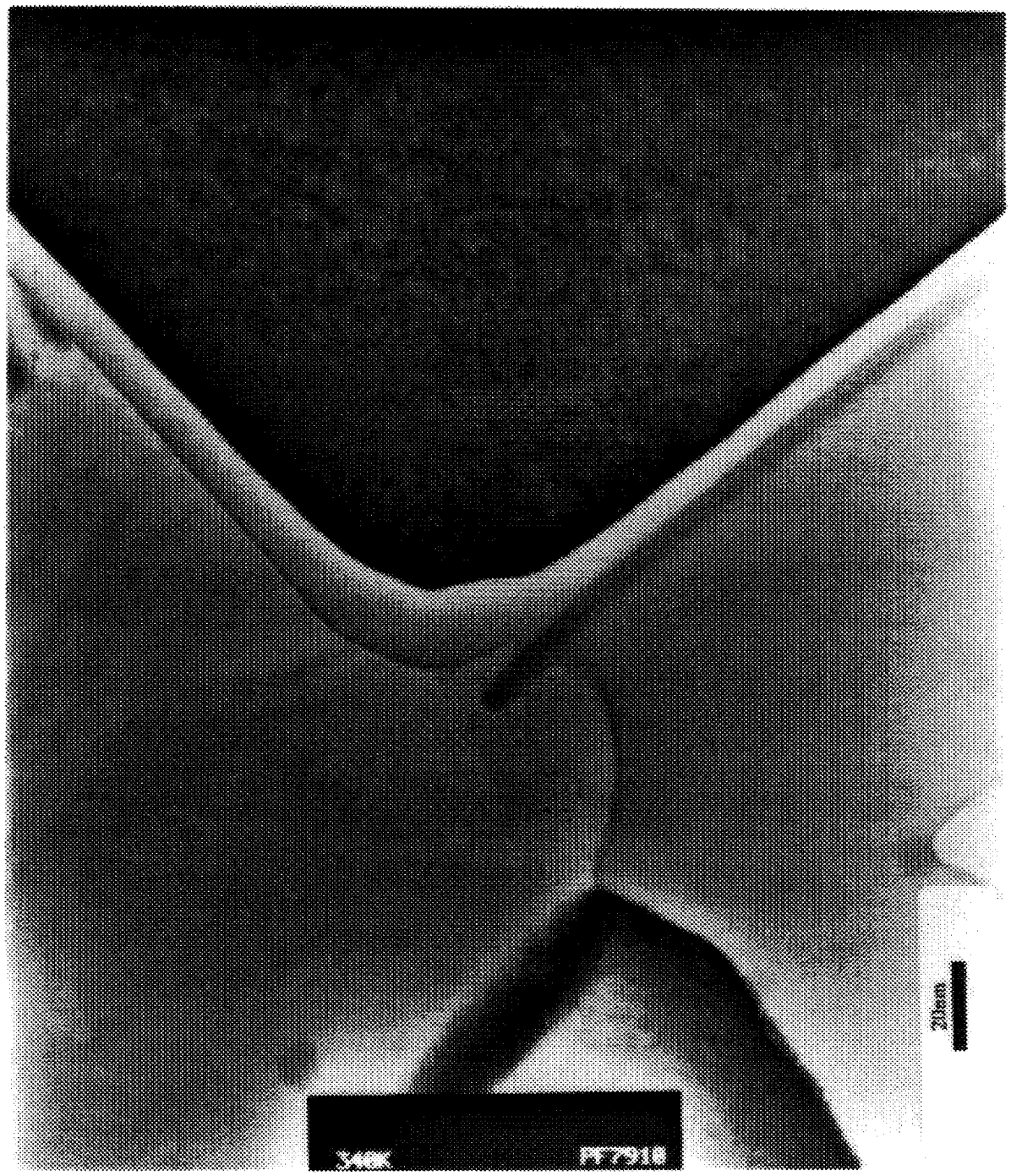

FIG. 6B is a TEM image of a preferred embodiment FET corner grown at 900° C. in dry $O_2$. For this preferred embodiment FET, the corner $T_{ox}$ is 70% thicker than center $T_{ox}$. The thickened oxide along the side of this preferred FET raises the corner $V_t$ nearly to that of the center channel $V_t$.

The table of FIG. 7 is a comparison of a prior art 10 μm wide FET's electrical parameters with a preferred embodiment 10 μm FET, each grown at the chip location on different wafers under nearly identical conditions. Although both devices have a nearly identical center channel $V_t$ and nearly identical on current ($I_{ds}$), the corner $V_t$ of the preferred FET is nearly equal to the center channel $V_t$. By contrast, the corner $V_t$ of the prior art FET is 75% that of the corner $V_t$ of the preferred embodiment FET. So, for the preferred embodiment device, the retention yield at 256 ms (the time that charge is held in a cell) is more than 2.6 times that of the prior art FET.

While the present invention is described in terms of preferred embodiments, it is understood that numerous variations and modifications will occur to a person skilled in the art without departing in spirit from the claimed invention. It is intended that the scope of the claims include those modifications and variations that fall within the spirit of the invention.

We claim:

1. An integrated circuit chip including a plurality of first FETs with a gate oxide of essentially uniform thickness formed in a first FET forming region and a plurality of second FETs with a gate oxide of nonuniform thickness formed in a second FET forming region, wherein:

said first FET forming region each comprising:

first and second isolation trenches formed in said semiconductor substrate defining a first intervening FET region, said first and second isolation trenches having trench sidewalls defining first and second sides of said first FET region, and a first interior FET region being centrally located between and spaced from said first and second sides of said first FET region, a first gate oxide located directly on said first FET region, said first gate oxide extending between said first and second trenches and across said surface of said first FET region, wherein said first gate oxide has essentially uniform thickness where both adjacent and meeting said first and second sides of said first FET region and where said first gate oxide is located on said first interior FET region that is centrally located between and spaced from said first and second sides of said first FET region; and said second FET forming region each comprising:

spaced-apart third and fourth isolation trenches formed in said semiconductor substrate defining a second intervening FET region, said third and fourth isolation trenches having trench sidewalls defining first and second sides of said second FET region, and a second interior FET region being centrally located between and spaced from said first and second sides of said second FET region, a dielectric layer containing potassium as an oxidation catalyst on and along said trench sidewalls bounding said second FET region, a second gate oxide located directly on said second FET region, said second gate oxide extending between said third and fourth trenches and across said surface of said second FET region, wherein said second gate oxide has a greater thickness where said second gate oxide is adjacent and meets said dielectric layer lining said first and second sides of said second FET region than where said second gate oxide is located on said second interior FET region that is centrally located between and spaced from said first and second sides of said second FET region.

2. The integrated circuit chip of claim 1 wherein the plurality of second FET forming region further include an oxide collar on each side of each of said second FETs.

3. The integrated circuit chip of claim 1 wherein said dielectric layer is an ONO layer.

4. The integrated circuit chip of claim 1 wherein said plurality of first FETs are isolated on either side by a trench.

5. The integrated circuit chip of claim 1 wherein the second FET forming region further includes an oxide collar on each side of each of said second FETs.

6. An integrated circuit chip including a plurality of first FETs with a gate oxide of essentially uniform thickness formed a first FET forming region and a plurality of second FETs with a gate oxide of nonuniform thickness formed in a second FET forming region, wherein:

said first FET forming region each comprising:

first and second isolation trenches formed in said semiconductor substrate defining a first intervening FET region, said first and second isolation trenches having trench sidewalls defining first and second sides of said first FET region, and a first interior FET region being centrally located between and spaced from said first and second sides of said first FET region, a first gate oxide located directly on said first FET region, said first gate oxide extending between said first and second trenches and across said surface of said first FET region, wherein said first gate oxide has essentially uniform thickness where both adjacent and meeting said first and second sides of said first FET region and where said first gate oxide is located on said first interior FET region that is centrally located between and spaced from said first and second sides of said first FET region; and said second FET forming region each comprising:

spaced-apart third and fourth isolation trenches formed in said semiconductor substrate defining a second intervening FET region, said third and fourth isolation trenches having trench sidewalls defining first and second sides of said second FET region, and a second interior FET region being centrally located between and spaced from said first and second sides of said second FET region, an ONO layer containing potassium on and along said trench sidewalls bounding said second FET region, a second gate oxide located directly on said second FET region, said second gate oxide extending between said third and fourth trenches and across said surface of said second FET region, wherein said second gate oxide has a greater thickness where said second gate oxide is adjacent and meets said ONO layer lining said first and second sides of said second FET region than where said second gate oxide is located on said second interior FET region that is centrally located between and spaced from said first and second sides of said second FET region.

7. The integrated circuit chip of claim 6 wherein said plurality of first FETs are isolated on either side by a trench.

* * * * *